(12) United States Patent
Kim et al.

(10) Patent No.: US 11,243,435 B2
(45) Date of Patent: Feb. 8, 2022

(54) DISPLAY DEVICE

(71) Applicant: Samsung Display Co., Ltd., Yongin-Si (KR)

(72) Inventors: Duk-Sung Kim, Asan-si (KR); Jung Hyun Kwon, Suwon-si (KR); Dong-Yoon Kim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/191,754

(22) Filed: Mar. 4, 2021

(65) Prior Publication Data

US 2021/0191199 A1 Jun. 24, 2021

Related U.S. Application Data

(63) Continuation of application No. 15/808,247, filed on Nov. 9, 2017, now Pat. No. 10,962,837.

(30) Foreign Application Priority Data

Nov. 18, 2016 (KR) .......................... 10-2016-0153903

(51) Int. Cl.
| | |
|---|---|
| G02F 1/1335 | (2006.01) |
| G02F 1/13357 | (2006.01) |
| H01L 27/12 | (2006.01) |
| G02F 1/1333 | (2006.01) |
| G02F 1/1368 | (2006.01) |

(52) U.S. Cl.
CPC ...... *G02F 1/133621* (2013.01); *G02F 1/1368* (2013.01); *G02F 1/133305* (2013.01); *G02F 1/133514* (2013.01); *G02F 1/133528* (2013.01); *G02F 1/133617* (2013.01); *H01L 27/1218* (2013.01); *H01L 27/1222* (2013.01); *G02F 1/133302* (2021.01); *G02F 1/133368* (2021.01); *G02F 1/133519* (2021.01); *G02F 1/133614* (2021.01); *G02F 1/133624* (2021.01); *G02F 2201/123* (2013.01); *G02F 2201/56* (2013.01); *G02F 2202/36* (2013.01)

(58) Field of Classification Search
CPC .................................................. G02F 1/133621
See application file for complete search history.

(56) References Cited

U.S. PATENT DOCUMENTS

| | | | |
|---|---|---|---|
| 7,532,274 B2 | 5/2009 | Fukuda | |
| 8,045,101 B2 | 10/2011 | Fukuda | |

(Continued)

FOREIGN PATENT DOCUMENTS

| | | |
|---|---|---|
| CN | 1881034 A | 12/2006 |
| CN | 1991494 A | 7/2007 |

(Continued)

*Primary Examiner* — Edmond C Lau
(74) *Attorney, Agent, or Firm* — Innovation Counsel LLP

(57) ABSTRACT

A display device according to the present disclosure includes: a color conversion panel; and a display panel overlapping the color conversion panel, wherein the color conversion panel includes a color conversion layer including a nano-crystalline semiconductor and a transmission layer, the display panel includes a first display panel including a first substrate and a thin film transistor disposed on the first substrate, a second display panel including a second substrate and overlapping the first display panel. The first substrate and the second substrate have different thicknesses.

14 Claims, 7 Drawing Sheets

(56) References Cited

U.S. PATENT DOCUMENTS

| | | |
|---|---|---|
| 8,164,717 B2 | 4/2012 | Fukuda |
| 8,241,735 B2 | 8/2012 | Murashige et al. |
| 8,558,965 B2 | 10/2013 | Fukuda |
| 8,568,603 B2 | 10/2013 | Tanabe et al. |
| 9,013,653 B2 | 4/2015 | Fukuda |
| 9,406,415 B2 | 8/2016 | Tanabe et al. |
| 9,612,470 B2 | 4/2017 | Choi et al. |
| 9,793,299 B2 | 10/2017 | Fukuda |
| 10,332,915 B2 | 6/2019 | Fukuda |
| 10,831,048 B2 | 11/2020 | Fukuda |
| 2005/0140839 A1 | 6/2005 | Ki Hong |
| 2006/0284532 A1 | 12/2006 | Kurihara et al. |
| 2007/0165170 A1 | 7/2007 | Fukuda |
| 2010/0053101 A1 | 3/2010 | Nozawa et al. |
| 2012/0019740 A1 | 1/2012 | Kadowaki et al. |
| 2013/0242228 A1* | 9/2013 | Park .................. G02F 1/133377 349/61 |
| 2014/0043566 A1 | 2/2014 | Lee et al. |
| 2014/0192294 A1 | 7/2014 | Chen et al. |
| 2015/0198844 A1 | 7/2015 | Choi et al. |
| 2015/0286097 A1 | 10/2015 | Lee et al. |
| 2015/0378193 A1 | 12/2015 | Song et al. |
| 2016/0231615 A1 | 8/2016 | Nam et al. |
| 2021/0018774 A1 | 1/2021 | Fukuda |

FOREIGN PATENT DOCUMENTS

| | | |
|---|---|---|
| CN | 101680968 A | 3/2010 |
| CN | 102356348 A | 2/2012 |
| CN | 102736301 A | 10/2012 |
| CN | 102956329 A | 3/2013 |
| CN | 104570460 A | 4/2015 |
| CN | 104865727 A | 8/2015 |

\* cited by examiner

DISPLAY DEVICE

CROSS-REFERENCE TO RELATED APPLICATION

This application is a continuation application of U.S. patent application Ser. No. 15/808,247 filed on Nov. 9, 2017, which claims priority under 35 USC § 119 to Korean Patent Application No. 10-2016-0153903 filed in the Korean Intellectual Property Office on Nov. 18, 2016, the disclosures of which are incorporated herein in their entirety by reference.

BACKGROUND

(a) Field

The present specification relates to a display device.

(b) Description of the Related Art

A liquid crystal display used as a display device includes two field generating electrodes, a liquid crystal layer, a color filter, and a polarizer. However, light loss is generated in the polarizer and the color filter of the display device. Accordingly, to realize a display device with reduced light loss and having high efficiency, a display device including a color conversion panel has been proposed.

The above information disclosed in this Background section is only for enhancement of understanding of the background of the inventive concept and therefore it may contain information that does not form the prior art that is already known in this country to a person of ordinary skill in the art.

SUMMARY

The present inventive concept provides a display device improved with improved color reproducibility and having a thin thickness. Also, a curved display device is provided.

The technical objects to be achieved by the present inventive concept are not limited to the aforementioned technical objects, and other unmentioned technical objects will be obviously understood by those skilled in the art from the description below.

A display device according to the present disclosure includes: a color conversion panel; and a display panel overlapping the color conversion panel, wherein the color conversion panel includes a color conversion layer including a nano-crystalline semiconductor and a transmission layer, and the display panel includes a first display panel including a first substrate and a thin film transistor disposed on the first substrate, a second display panel including a second substrate and overlapping the first display panel, and a liquid crystal layer disposed between the first display panel and the second display panel. The first substrate and the second substrate may have different thicknesses.

One of the first substrate and the second substrate disposed close to the color conversion panel may have a thickness less than that of the other substrate disposed far away from the color conversion panel.

The first display panel may be disposed between the liquid crystal layer and the color conversion panel.

A light unit disposed at a rear surface of the display panel, a first polarizer disposed between the display panel and the color conversion panel, and a second polarizer disposed between the display panel and the light unit may be further included.

A light unit disposed at a rear surface of the display panel, a first polarizer disposed between the first substrate and the liquid crystal layer, and a second polarizer disposed between the display panel and the light unit may be further included.

The display device may be a curved display device.

The first display panel may further include a pixel electrode disposed between the thin film transistor and the liquid crystal layer. The first substrate may be disposed between the color conversion panel and the liquid crystal layer, the thin film transistor may be disposed between the first substrate and the liquid crystal layer, and the first substrate may be one of a glass substrate and a plastic substrate.

The thickness of the glass substrate may be greater than about 0.03 mm and less than about 0.07 mm.

The thickness of the plastic substrate may be about 0.01 mm or less.

The second display panel may be disposed between the liquid crystal layer and the color conversion panel.

The second substrate may be disposed between the color conversion panel and the liquid crystal layer, and the second substrate may be one of a glass substrate and a plastic substrate.

The thickness of the glass substrate may be greater than about 0.03 mm and less than about 0.07 mm.

The thickness of the plastic substrate may be about 0.01 mm or less.

The color conversion layer may include a third substrate overlapping the display panel, and the color conversion layer and the transmission layer may be disposed between the third substrate and the display panel.

A blue light cutting filter disposed between the third substrate and the color conversion layer may be further included.

An overcoat layer disposed between the color conversion layer and the display panel and between the transmission layer and the display panel may be further included.

A display device according to an exemplary embodiment of the present inventive concept includes: a color conversion panel; and a display panel overlapping the color conversion panel, wherein the color conversion panel includes a color conversion layer including a nano-crystalline semiconductor and a transmission layer, the display panel includes a first display panel including a first substrate and a thin film transistor disposed on the first substrate, a second display panel including a second substrate and overlapping the first display panel, and a liquid crystal layer disposed between the first display panel and the second display panel, and the first display panel is disposed between the liquid crystal layer and the color conversion panel.

The first substrate may have a thickness less than that of the second substrate.

The display device may be a curved display device.

The display device may further include a pixel electrode disposed between the thin film transistor and the liquid crystal layer. The first substrate may be disposed between the color conversion panel and the liquid crystal layer, and the thin film transistor may be disposed between the first substrate and the liquid crystal layer. The first substrate may be one of a glass substrate having a thickness from about 0.03 mm to about 0.07 mm and a plastic substrate having a thickness less than about 0.01 mm.

A display device according to an exemplary embodiment of the present inventive concept includes a color conversion panel; and a display panel overlapping the color conversion panel, wherein the color conversion panel includes a color conversion layer including a nano-crystalline semiconductor and a transmission layer, the display panel includes a first substrate where on which a thin film transistor is located, and a thin film encapsulation layer overlapping the first substrate, wherein the thickness of one of the first substrate and the thin film encapsulation layer disposed close to the color conversion panel is about 0.07 mm or less.

The display panel may comprise light emitting diode.

According to the above-described exemplary embodiment, the display device including the color conversion panel includes the display panel of the thin thickness, thereby reducing thickness and weight of the device. Also, the polarizer may be stably formed such that reliability of the device may be improved. Also, even if the panels are applied to a curved display device, misalignment between the panels may be prevented and a color mixture according thereto may be controlled.

DETAILED DESCRIPTION OF THE EMBODIMENTS

Figure 1:
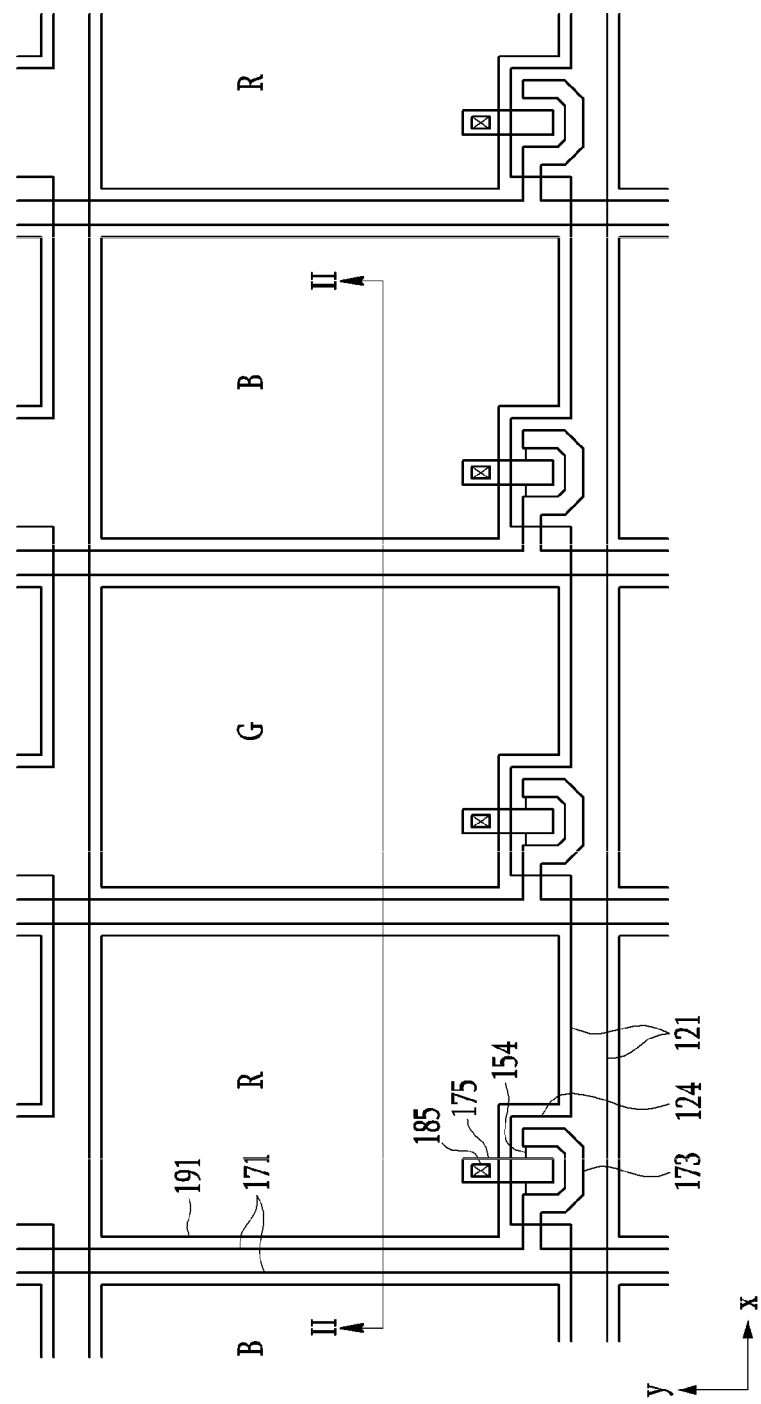
FIG. 1 is a partial top plan view of a display device according to an exemplary embodiment of the present inventive concept.

Exemplary embodiments of the present inventive concept will be described in detail with reference to the accompanying drawings. In describing the present inventive concept, a description of known functions or configurations will be omitted so as to make the subject matter of the present inventive concept clearer.

To clearly describe the present inventive concept, portions which do not relate to the description are omitted, and like reference numerals designate like elements throughout the specification. The size and thickness of each component shown in the drawings are arbitrarily shown for better understanding and ease of description, but the present inventive concept is not limited thereto.

In the drawings, the thickness of layers, films, panels, regions, etc., are exaggerated for clarity. For better understanding and ease of description, the thickness of some layers and areas is exaggerated. It will be understood that when an element such as a layer, film, region, or substrate is referred to as being "on" another element, it can be directly on the other element or intervening elements may also be present.

Now, a display device according to an exemplary embodiment will be described with reference to FIG. 1 and FIG. 2. FIG. 1 is a partial top plan view of a display device according to an exemplary embodiment of the present inventive concept, and FIG. 2 is a cross-sectional view taken along a line II-II of FIG. 1.

Figure 2:
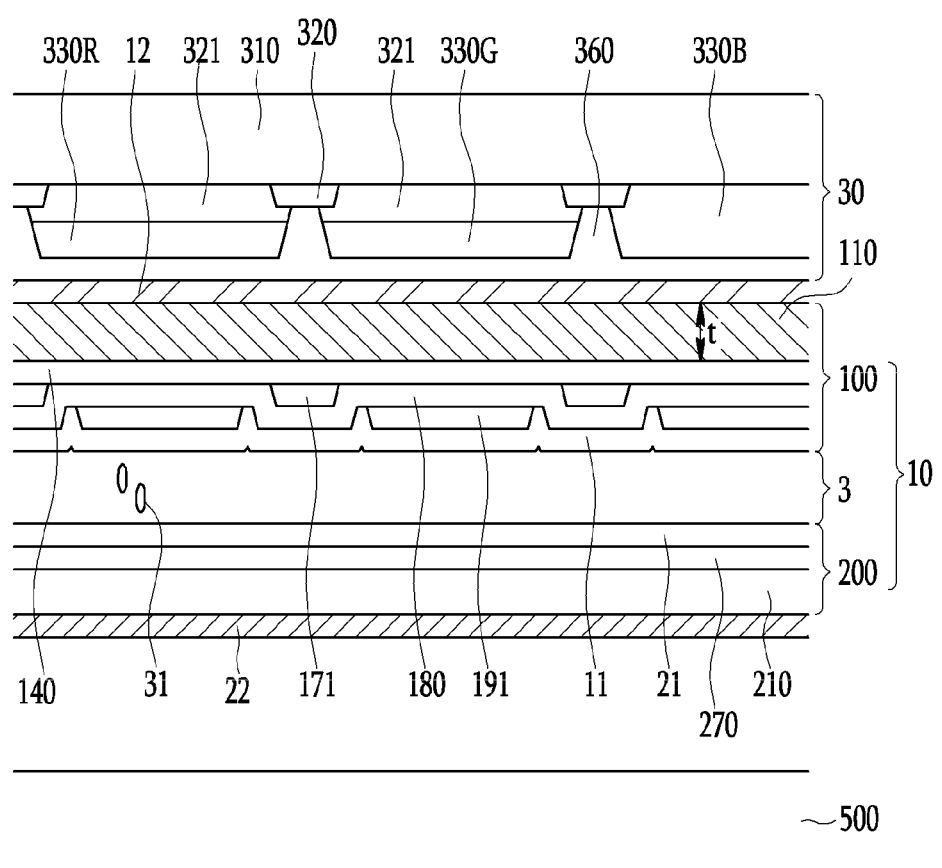
FIG. 2 is a cross-sectional view taken along a line II-II of FIG. 1.

Referring to FIG. 1 and FIG. 2, the display device according to an exemplary embodiment includes a light unit 500, a display panel 10 disposed on the light unit 500, and a color conversion panel 30 disposed on the display panel 10. The display panel 10 may be disposed between the color conversion panel 30 and the light unit 500.

The light unit 500 may include a light source disposed at a rear surface of the display panel 10 and generating light, and a light guide (not shown) receiving the light and guiding the received light in the direction of the display panel 10 and the color conversion panel 30. When the display panel 10 is an organic light emitting diode display, the light unit 500 may be omitted.

The light unit 500 may include at least one light emitting diode (LED), and as one example, it may be a blue light emitting diode (LED). The light source according to one example may be an edge type light source disposed on at least one lateral surface of the light guide, or a direct type light source in which the light source of the light unit 500 is disposed directly under the light guide (not shown), but is not limited thereto.

The display panel 10 may include a liquid crystal panel forming a vertical electric field, however it is not limited thereto, and the display panel 10 may be a liquid crystal panel forming a horizontal electric field, a plasma display panel (PDP), an organic light emitting diode display (OLED), a surface conduction electron-emitter display (SED), a field emission display (FED), a vacuum fluorescent display (VFD), an E-paper, and the like. Next, the display panel 10 forming the vertical electric field will be described in detail.

The display panel 10 according to an exemplary embodiment of the present inventive concept is disposed between the light unit 500 and the color conversion panel 30. The display panel 10 includes a first display panel 100 including a thin film transistor, a second display panel 200 overlapping the first display panel 100, and a liquid crystal layer 3 disposed between the first display panel 100 and the second display panel 200. Particularly, according to an exemplary embodiment, the first display panel 100 may be disposed between the liquid crystal layer 3 and the color conversion panel 30, and the second display panel 200 may be disposed between the liquid crystal layer 3 and the light unit 500. The second display panel 200, the liquid crystal layer 3, the first display panel 100, and the color conversion panel 30 are sequentially disposed on the light unit 500.

The display panel 10 may include a first polarizer 12 disposed between the first display panel 100 and the color conversion panel 30 and a second polarizer 22 disposed between the second display panel 200 and the light unit 500. The first polarizer 12 and the second polarizer 22 polarize the light incident from the light unit 500.

The first polarizer 12 and the second polarizer 22 may be one or more of a deposited-type polarizer, a coating-type polarizer, and a wire grid polarizer. The first and second polarizers 12 and 22 may be disposed at one surface of the display panels 100 and 200 by various methods such as a film type, a coating type, and an attaching type. A thickness of the first polarizer 12 and the second polarizer 22 may be less than about 50 μm. However, this description corresponds to one example and the present inventive concept is not limited thereto.

After the first polarizer 12 and the second polarizer 22 are formed on the display panel 10, the display panel 10 and the color conversion panel 30 may be combined. The first polarizer 12 and the second polarizer 22 may be formed on one surface of a first substrate 110 and a second substrate 210, respectively, that are included in the display panel 10. The first substrate 110 and the second substrate 210 provide a flat surface such that the first polarizer 12 and the second polarizer 22 may be stably formed.

The first display panel 100 includes the first substrate 110, and a plurality of pixels are arranged in a matrix shape on the first substrate 110. The first substrate 110 is disposed between the color conversion panel 30 and the liquid crystal layer 3.

The first substrate 110 according to an exemplary embodiment may be a glass substrate or a plastic substrate and may have a thickness less than that of the second substrate 210.

When the first substrate 110 is the glass substrate, a thickness t of the first substrate 110 may be greater than about 0.03 mm and less than about 0.07 mm. The first substrate 110 may be provided by etching the glass substrate having a thicker thickness than the above-described range or by providing the glass substrate itself having the thickness of the above-described range.

When the first substrate 110 is the plastic substrate, the thickness t of the first substrate 110 may be less than about 0.01 mm. When using the plastic first substrate 110, constituent elements are sequentially formed on the first substrate 110 after disposing the first substrate 110 on a carrier glass. After forming the constituent elements on the plastic first substrate 110, the plastic first substrate 110 is detached from the carrier glass, however it is not limited thereto.

Because a thickness of the first substrate 110 according to an exemplary embodiment is thin, a length of a path of the light passing through the liquid crystal layer 3, the first display panel 100 and the color conversion panel 30 may be reduced.

Between the first substrate 110 and the liquid crystal layer 3, a gate line 121 extending in an x direction and including a gate electrode 124 is disposed. A gate insulating layer 140 is disposed between the gate line 121 and the liquid crystal layer 3. A semiconductor layer 154 is disposed between the gate insulating layer 140 and the liquid crystal layer 3. A data line 171 connected to a source electrode 173 is disposed between the semiconductor layer 154 and the liquid crystal layer 3. A passivation layer 180 is disposed between the data line 171 and the liquid crystal layer 3. A pixel electrode 191 physically and electrically connected to a drain electrode 175 through a contact hole 185 is disposed between the passivation layer 180 and the liquid crystal layer 3. A first alignment layer 11 may be disposed between the pixel electrode 191 and the liquid crystal layer 3.

The semiconductor layer 154 forms a channel layer in a region exposed by the source electrode 173 and the drain electrode 175, and the gate electrode 124, the semiconductor layer 154, the source electrode 173, and the drain electrode 175 form one thin film transistor.

The second display panel 200 is disposed between the liquid crystal layer 3 and the light unit 500.

The second substrate 210 included in the second display panel 200 overlaps and is separated from the first substrate 110. A common electrode 270 may be disposed between the second substrate 210 and the liquid crystal layer 3, and a second alignment layer 21 may be disposed between the common electrode 270 and the liquid crystal layer 3.

The common electrode 270 applied with the common voltage forms an electric field with the pixel electrode 191, thereby arranging a plurality of liquid crystal molecules 31 disposed in the liquid crystal layer 3.

The liquid crystal layer 3 includes the plurality of liquid crystal molecules 31, and arrangement of the liquid crystal molecules 31 is controlled by the electric field between the pixel electrode 191 and the common electrode 270. Transmittance of the light received from the light unit 500 is controlled by the rearrangement of the liquid crystal molecules, thereby displaying the image.

The color conversion panel 30 includes a third substrate 310 disposed on the display panel 10 and facing the display panel 10.

A light blocking member 320 is disposed between the third substrate 310 and the display panel 10. The light blocking member 320 may be disposed between adjacent color conversion layers, for example, between a red color conversion layer 330R and a green color conversion layer 330G, between the green color conversion layer 330G and a transmission layer 330B, and between the transmission layer 330B and the red color conversion layer 330R. In other words, the light blocking member 320 may define regions where the red color conversion layer 330R, the green color conversion layer 330G, and the transmission layer 330B are disposed.

A blue light cutting filter 321 is disposed between the third substrate 310 and the color conversion layers. The blue light cutting filter 321 may overlap a part of the light blocking member 320, for example, edges of the light blocking member 320.

The blue light cutting filter 321 is disposed to overlap the red color conversion layer 330R and the green color conversion layer 330G, and is not disposed on the transmission layer 330B.

The present specification describes an exemplary embodiment in which the blue light cutting filter 321 disposed at the region emitting the red light and the blue light cutting filter 321 disposed at the region emitting the green light are separated. However, it is not limited thereto, and the blue light cutting filter 321 disposed at the region emitting the red light and the blue light cutting filter 321 positioned at the region emitting the green light may be connected to each other. Thus, the blue light cutting filter 321 may have an opening overlapping the transmission layer 330B.

The blue light cutting filter 321 transmits the light having a wavelength other than a wavelength band of the blue light, and blocks the light having the wavelength band of the blue light. The blue light cutting filter 321 may include any material for performing the above-described effect, and as an example, it may be a yellow color filter.

The present specification shows an exemplary embodiment in which the blue light cutting filter 321 is in contact with the third substrate 310. However, the present exemplary embodiment is not limited thereto, and it may further include a buffer layer disposed between the blue light cutting filter 321 and the third substrate 310 while being disposed on the entire surface of the third substrate 310 except a region corresponding to the transmission layer 330B.

A plurality of color conversion layers 330R and 330G are disposed between the blue light cutting filter 321 and the first substrate 110. The transmission layer 330B is disposed between the third substrate 310 and the first substrate 110

The plurality of color conversion layers 330R and 330G may convert the incident light as light of the different colors, and as one example, they may be a red color conversion layer 330R and a green color conversion layer 330G. The transmission layer 330B may emit the incident light without color conversion, and as one example, the blue light from the light unit 500 may pass through the transmission layer 330B without color conversion, thus the transmission layer 330B may emit the blue light.

The red color conversion layer 330R may include a nano-crystalline semiconductor which converts the incident blue light into the red light. The nano-crystalline semiconductor may include at least one of a phosphor and a quantum dot.

When the red color conversion layer 330R includes a red phosphor, the red phosphor may contain one of (Ca, Sr, Ba)S, (Ca, Sr, Ba)2Si5N8, CaAlSiN3, CaMoO4, and Eu2Si5N8, but is not limited thereto. The red color conversion layer 330R may include at least one kind of red phosphor.

The green color conversion layer 330G may include a nano-crystalline semiconductor which converts the incident blue light into the green light. The nano-crystalline semiconductor may include at least one of the phosphor and the quantum dot.

When the green color conversion layer 330G includes the green phosphor, the green phosphor may contain one of yttrium aluminum garnet (YAG), (Ca, Sr, Ba)2SiO4, SrGa2S4, BAM, α-SiAlON, β-SiAlON, Ca3Sc2Si3O12, Tb3Al5O12, BaSiO4, CaAlSiON, and (Sr(1−x)Bax)Si2O2N2, but the present disclosure is not limited thereto. The green color conversion layer 330G may include at least one kind of green phosphor. In this case, the x may be any number between 0 and 1.

The red color conversion layer 330R and the green color conversion layer 330G may include a quantum dot for converting color instead of the phosphor. In this case, the quantum dot may be selected from a Group II-VI compound, a Group III-V compound, a Group IV-VI compound, a Group IV element, a Group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from a two-element compound selected from GaN, GaP, GaAs, GaSb, AN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a four-element compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof. The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may exist in particles at a uniform concentration, or in the same particle while being divided to have partially different concentration distributions. Alternatively, they may have a core/shell structure where one quantum dot encloses another quantum dot. An interface between the core and the shell may have a concentration gradient such that a concentration of an element existing in the shell gradually decreases closer to a center of the interface.

The quantum dots may have a full width at half maximum (FWHM) of a light-emitting wavelength spectrum of about 45 nm or less, preferably about 40 nm or less, and more preferably about 30 nm or less, such that the color purity and the color reproducibility may be improved. Also, the light emitted through these quantum dots is emitted in all directions, thereby the light viewing angle may be improved.

In addition, shapes of the quantum dots are not specifically limited to shapes that are generally used in the related art, but more specifically, it may be a nanoparticle having a spherical, pyramidal, multi-arm, or cubic shape, and a nanotube, a nanowire, a nanofiber, and a planar nanoparticle may be used.

The transmission layer 330B may include a resin transmitting the incident blue light. The transmission layer 330B disposed at the region emitting the blue light does not include the nano-crystalline semiconductor, and emits the incident blue light as it is. Although not shown in the present specification, the transmission layer 330B may include a dye or a pigment according to an exemplary embodiment.

The above-described light blocking member 320, red color conversion layer 330R, green color conversion layer 330G, and transmission layer 330B may include a photosensitive resin as one example, and may be formed by a photolithography process. Also, they may be formed through a printing process. In this case, the light blocking member 320, the red color conversion layer 330R, the green color conversion layer 330G, and the transmission layer 330B may be another material other than the photosensitive resin. The present specification describes the color conversion layer, the transmission layer, and the light blocking member that are formed by the photolithography process or the printing process, however it is not limited thereto.

At least one among the red color conversion layer 330R, the green color conversion layer 330G, and the transmission layer 330B may further include a scatterer (not shown). For example, the red color conversion layer 330R, the green color conversion layer 330G, and the transmissive layer 330B may respectively include the scatterer, but they are not limited thereto, and the transmissive layer 330B may include the scatterer, while the red color conversion layer 330R and the green color conversion layer 330G may not include the scatterer. A content of each scatterer included in the red color conversion layer 330R, the green color conversion layer 330G, and the transmission layer 330B may be different from each other.

The scatterer may include any material that can evenly scatter incident light, and for example, may include one of TiO2, ZrO2, Al2O3, In2O3, ZnO, SnO2, Sb2O3, and ITO.

An overcoat layer 360 is disposed between the red color conversion layer 330R, the green color conversion layer 330G, the transmission layer 330B, and the light blocking member 320, and the display panel 10. The overcoat layer 360 planarizes one surface of the red color conversion layer 330R, the green color conversion layer 330G, the transmission layer 330B, and the light blocking member 320, and may be omitted depending on an exemplary embodiment.

Although not shown in the present specification, a photo-filter layer (not shown) may be disposed between the color conversion layers 330R and 330G and the transmission layer 330B, and the overcoat layer 360.

The photo-filter layer may be a filter preventing damage and extinction of the phosphor or the quantum dot included in the red color conversion layer 330R and the green color conversion layer 330G in a high temperature process after the red color conversion layer 330R, the green color conversion layer 330G, and the transmission layer 330B are formed, and transmits light of a predetermined wavelength and reflects or absorbs light except for that of the predetermined wavelength.

The photo-filter layer may include a structure in which inorganic films having a high refractive index and inorganic films having a low refractive index are alternately stacked about 10 to 20 times. That is, the photo-filter layer may have a structure in which a plurality of layers having different refractive indexes are stacked. In this case, the photo-filter layer may reflect or absorb light of a specific wavelength. It may transmit or/and reflect the light of a specific wavelength by using reinforcement interference and/or destructive interference between the inorganic film having the high refractive index and the inorganic film having the low refractive index.

The photo-filter layer may include at least one of TiO2, SiNx, SiOx, TiN, AlN, Al2O3, SnO2, WO3, and ZrO2, and for example, may be a structure in which SiNx and SiOx are alternately stacked.

The display device according to an exemplary embodiment may be a curved display device that is curved in one direction.

The first display panel 100 which includes the pixel electrode 191 may be attached to the color conversion panel 30. Thus, when curving the display device, since the color conversion panel 30 and the first display panel 100 are combined to each other, a misalignment between the color conversion panel 30 and the first display panel 100 may be prevented and color mixture may be controlled. Also, because the first substrate 110 disposed adjacent to the color conversion panel 30 is thin, a light path toward the color conversion panel 30 through the liquid crystal layer 3 may also be shortened. Accordingly, the color mixture between the color conversion layer and the transmission layer adjacent to each other may be prevented.

In contrast, when the second display panel 200 which includes the common electrode 270 and the color conversion panel 30 are combined, the first display panel 100 which includes the thin film transistor may be disposed far away from the color conversion panel 30. In this case, when curving the display device, the misalignment between the pixel electrode 191 and the color conversion layer 330 R and 330G and the transmission layer 330B may be occurred. When the color mixture is occurred in the display device due to the misalignment between the pixel electrode 191 and the color conversion layer 330 R and 330G and the transmission layer 330B, the performance of the display device may be deteriorated.

Figure 3:
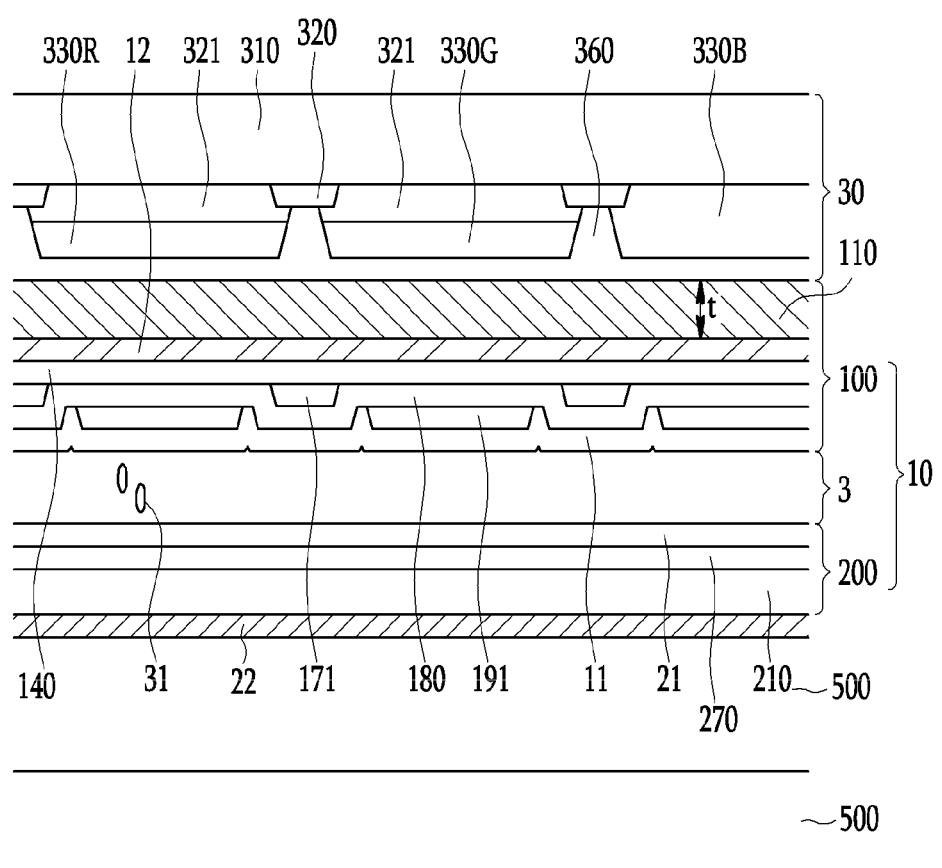
FIG. 3 is a cross-sectional view of a display device according to another exemplary embodiment.

Next, the display device according to another exemplary embodiment will be described with reference to FIG. 3 as well as FIG. 1. FIG. 3 is a cross-sectional view of a display device according to another exemplary embodiment. The detailed description for the same or similar constituent elements as those the above-described exemplary embodiment is omitted.

The display device according to an exemplary embodiment of FIG. 3 includes a light unit 500, a display panel 10 positioned on the light unit 500, and a color conversion panel 30 positioned on the display panel 10.

The display panel 10 includes a first display panel 100, a second display panel 200 overlapping the first display panel 100, and a liquid crystal layer 3 disposed between the first display panel 100 and the second display panel 200. According to an exemplary embodiment, the first display panel 100 is disposed between the color conversion panel 30 and the liquid crystal layer 3, and the second display panel 200 is disposed between the light unit 500 and the liquid crystal layer 3.

The first display panel 100 includes a first substrate 110, and a first polarizer 12 is disposed between the first substrate 110 and the liquid crystal layer 3. A second polarizer 22 is disposed between the display panel 10 and the light unit 500. That is, the first polarizer 12 may be disposed inside the display panel 10, and the second polarizer 22 may be disposed outside the display panel 10.

The first polarizer 12 and the second polarizer 22 may be one more of a deposited-type polarizer, a coating-type polarizer, and a wire grid polarizer. The first and second polarizers 12 and 22 may be disposed at one surface of the display panels 100 and 200 by various methods such as a film type, a coating type, or an attaching type. Also, the thickness of the first polarizer 12 and the second polarizer 22 may be less than about 50 μm. However, this description corresponds to one example, and the present inventive concept is not limited thereto.

The first substrate 110 according to an exemplary embodiment may be a glass substrate or a plastic substrate and may have a thickness less than that of the second substrate 210.

When the first substrate 110 is the glass substrate, the thickness t of the first substrate 110 may be greater than about 0.03 mm and less than about 0.07 mm. The first substrate 110 may be provided by etching the glass substrate having a predetermined thickness or by providing the glass substrate itself having a thickness of the above-described range.

When the first substrate 110 is the plastic substrate, the thickness t of the first substrate 110 may be less than about 0.01 mm. When using the plastic first substrate 110, constituent elements are sequentially formed on the first substrate 110 after disposing the first substrate 110 on the carrier glass. After forming the constituent elements on the plastic first substrate 110, the plastic first substrate 100 is detached from the carrier glass, however it is not limited thereto.

Because a thickness of the first substrate 110 according to an exemplary embodiment thin, the length of a path of the light passing through the liquid crystal layer 3, the first display panel 100 and the color conversion panel 30 may be reduced.

The first display panel 100 includes the first polarizer 12 disposed between the first substrate 110 and the liquid crystal layer 3. The first polarizer 12 may be formed directly on the first substrate 110. Next, as shown in FIG. 1, the gate line 121 extending in the x direction and including the gate electrode 124 is disposed between the first polarizer 12 and the liquid crystal layer 3, the gate insulating layer 140 is disposed between the gate line 121 and the liquid crystal layer 3, and the semiconductor layer 154 is disposed between the gate insulating layer 140 and the liquid crystal layer 3. The data line 171 extending in the y direction and including the source electrode 173 are disposed between the semiconductor layer 154 and the liquid crystal layer 3, and the passivation layer 180 and the pixel electrode 191 electrically connected to the drain electrode 175 through the contact hole 185 are disposed between the data line 171 and a drain electrode 175, and the liquid crystal layer 3. The first alignment layer 11 may be disposed between the pixel electrode 191 and the liquid crystal layer 3.

The second display panel 200 is disposed between the liquid crystal layer 3 and the light unit 500. The second substrate 210 included in the second display panel 200 overlaps and is separated from the first substrate 110. The common electrode 270 may be disposed between the second substrate 210 and the liquid crystal layer 3, and the second alignment layer 21 may be disposed between the common electrode 270 and the liquid crystal layer 3.

In the display device according to the exemplary embodiment of FIG. 3, the first polarizer 12 may be disposed on one surface of the first substrate 110, and particularly it may be disposed on the flat surface of the first substrate 110. Accordingly, the first polarizer 12 with a stable shape may be provided. Therefore, the reliability of the display device including the first polarizer 12 may be improved.

Figure 4:
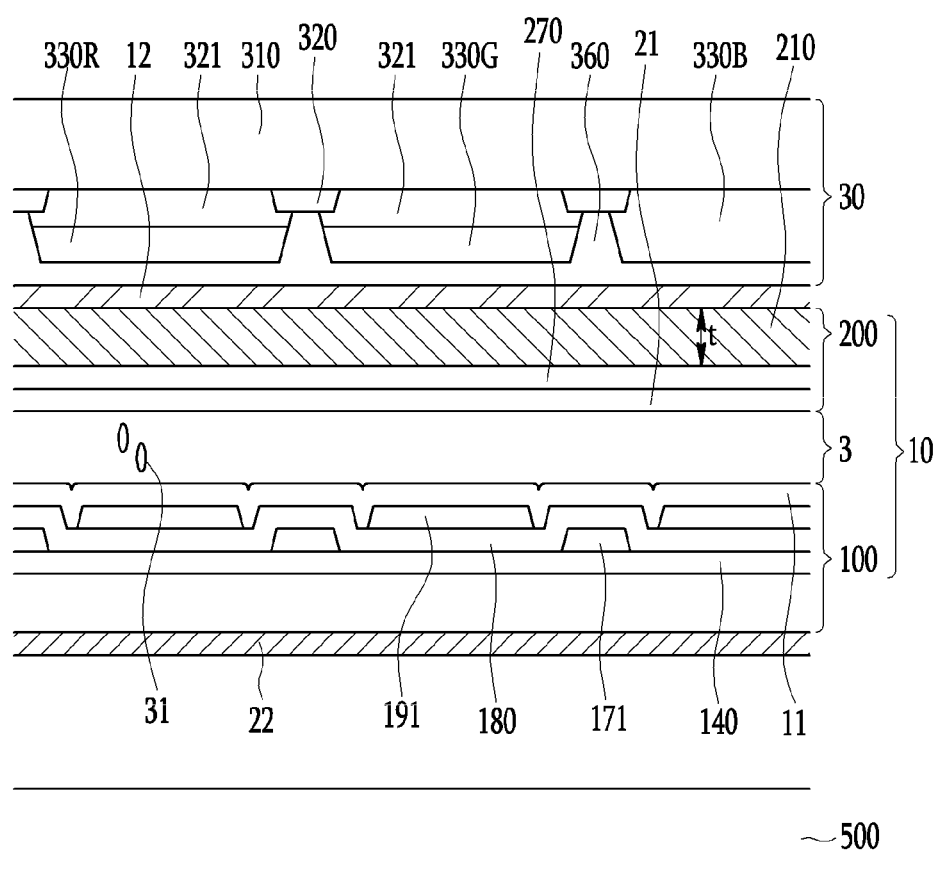
FIG. 4 is a cross-sectional view of a display device according to another exemplary embodiment.

Next, the display device according to another exemplary embodiment will be described with reference to FIG. 4 as well as FIG. 1. FIG. 4 is a cross-sectional view of a display device according to another exemplary embodiment. The detailed description of the constituent elements that are the same as or similar to those in the above-described exemplary embodiment is omitted.

The display device according to the exemplary embodiment of FIG. 4 includes the light unit 500, the display panel 10 disposed on the light unit 500, and the color conversion panel 30 disposed on the display panel 10.

The display panel 10 includes a first display panel 100, a second display panel 200 overlapping the first display panel 100, and a liquid crystal layer 3 disposed between the first display panel 100 and the second display panel 200. The first display panel 100 may be disposed between the light unit 500 and the liquid crystal layer 3, and the second display panel 200 may be disposed between the color conversion panel 30 and the liquid crystal layer 3.

The first polarizer 12 may be disposed between the display panel 10 and the light unit 500, and the second polarizer 22 may be disposed between the display panel 10 and the color conversion panel 30. However, the second polarizer 22 is not limited thereto, and an exemplary embodiment in which the second polarizer 22 may be disposed inside the display panel 10.

The first polarizer 12 and the second polarizer 22 may be one or more of the deposited-type polarizer, the coating-type polarizer, and the wire grid polarizer. The first and second polarizers 12 and 22 may be disposed at one surface of the display panels 100 and 200 by various methods such as the film type, the coating type, and the attaching type. Also, the thickness of the first polarizer 12 and the second polarizer 22 may be less than about 50 μm. However, this description corresponds to one example, and the present inventive concept is not limited thereto.

The first display panel 100 according to the exemplary embodiment shown in FIG. 4 is disposed between the liquid crystal layer 3 and the light unit 500, and includes the first substrate 110.

Referring to FIG. 4 as well as FIG. 1, the first display panel 100 includes the gate line 121 extending in the x direction and including the gate electrode 124 disposed between the first substrate 110 and the liquid crystal layer 3, the gate insulating layer 140 disposed between the gate line 121 and the liquid crystal layer 3, the semiconductor layer 154 disposed between the gate insulating layer 140 and the liquid crystal layer 3, the data line 171 extending in the y direction and including the source electrode 173 disposed between the semiconductor layer 154 and the liquid crystal layer 3, the passivation layer 180 disposed between the data line 171 and a drain electrode 175, and the liquid crystal layer 3, and the pixel electrode 191 physically and electrically connected to the drain electrode 175 through the contact hole 185. The first alignment layer 11 may be disposed between the pixel electrode 191 and the liquid crystal layer 3.

The second display panel 200 is disposed between the liquid crystal layer 3 and the color conversion panel 30, and includes the second substrate 210. The second substrate 210 overlaps the first substrate 110 with a liquid crystal layer 3 disposed therebetween. The second substrate 210 may have a thickness less than that of the first substrate 110.

The second substrate 210 may be the glass substrate or the plastic substrate. When the second substrate 210 is the glass substrate, the thickness t of the first substrate 110 may be greater than about 0.03 mm and less than about 0.07 mm. The second substrate 210 may be provided by etching the glass substrate having a thicker thickness than the above-described range, or by providing the glass substrate itself having a thickness of the above-described range.

When the second substrate 210 is the plastic substrate, the thickness t of the second substrate 210 may be less than about 0.01 mm. When using the plastic second substrate 210, the second substrate 210 is disposed on the carrier glass (not shown), and then the second display panel 200 is manufacturing by using the second substrate 210 disposed on the carrier glass. After forming the constituent elements on the plastic first substrate 110, the carrier glass may be detached from the plastic first substrate 110, however it is not limited thereto.

The second substrate 210 according to an exemplary embodiment is thin such that the length of the light path passing through the liquid crystal layer 3, the second display panel 200 and the color conversion panel 30 may be reduced.

The common electrode 270 may be disposed between the second substrate 210 and the liquid crystal layer 3, and the second alignment layer 21 may be disposed between the common electrode 270 and the liquid crystal layer 3.

Figure 5:
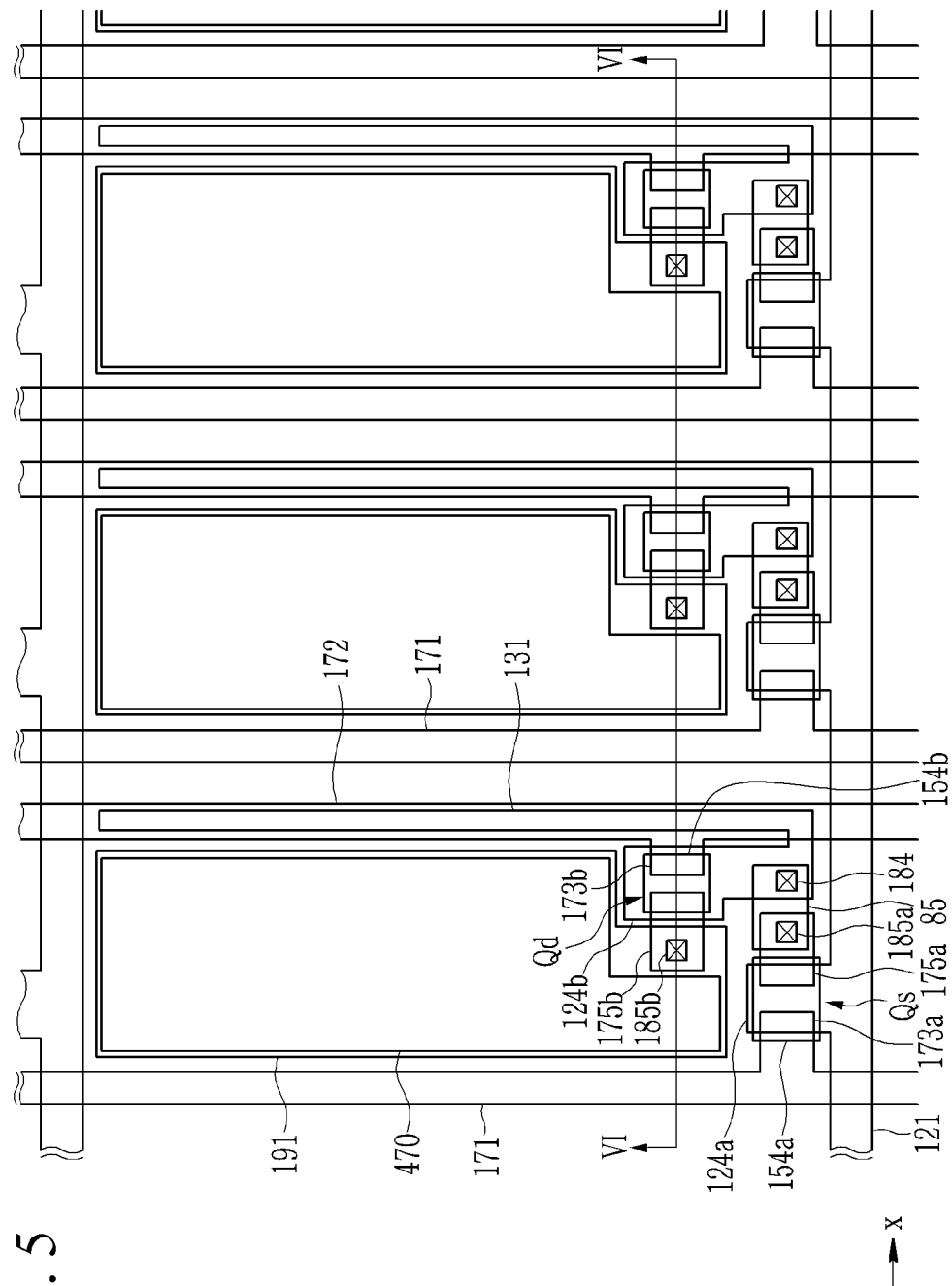
FIG. 5 is a top plan view of a display device according to an exemplary embodiment of the present inventive concept.

Now, a display device according to an exemplary embodiment will be described with reference to FIG. 5, FIG. 6 and FIG. 7. FIG. 5 is a top plan view of a display device according to an exemplary embodiment of the present inventive concept, and FIG. 6 is a cross-sectional view taken along a line VI-VI of FIG. 5, and FIG. 7 is a cross-sectional view of a display device according to another exemplary embodiment.

Figure 6:
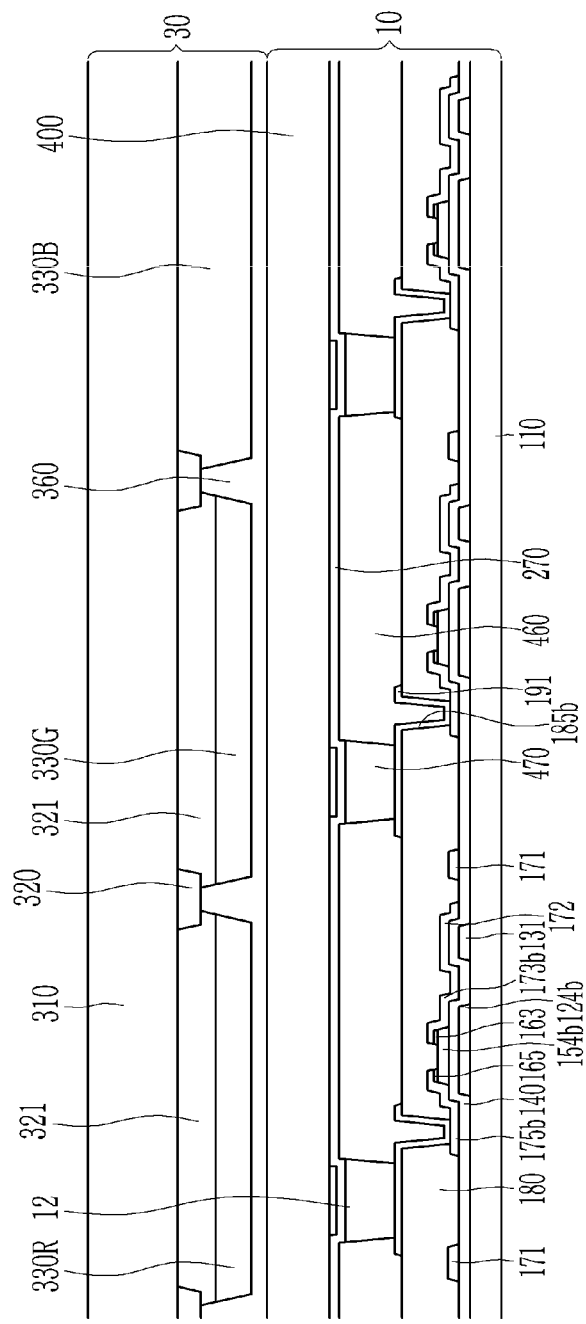
FIG. 6 is a cross-sectional view taken along a line VI-VI of FIG. 5.
Figure 7:
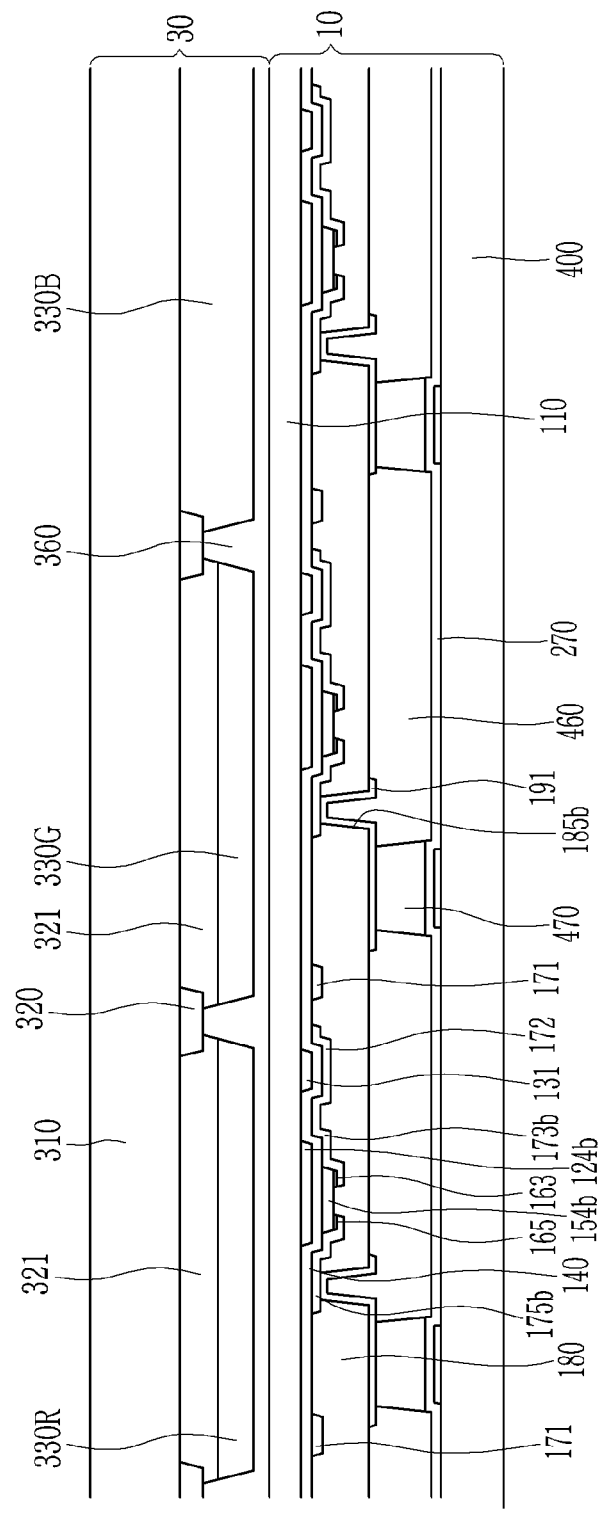
FIG. 7 is a cross-sectional view of a display device according to another exemplary embodiment.

Referring to FIG. 5 and FIG. 6, the display device illustrated in FIG. 5 and FIG. 6 includes a display panel 10 and a color conversion panel 30 disposed on the display panel 10. Since the color conversion panel 30 illustrated in FIGS. 6 and 7 is the same as the color conversion panel 30 according to the exemplary embodiment of FIG. 2, described above, a detailed description thereof will be omitted.

The display panel 10 includes gate conductors including a gate line 121 a first gate electrode 124a, and a second gate electrode 124b, on a first substrate 110.

A gate insulating layer 140 made of a silicon nitride ($SiN_x$), a silicon oxide ($SiO_y$), or the like is disposed on the gate conductors 121, 124a, and 124b.

A first semiconductor layer 154a and a second semiconductor layer 154b including hydrogenated amorphous silicon (abbreviated as a-Si for amorphous silicon) or polycrystalline silicon are disposed on the gate insulating layer 140.

The first semiconductor layer 154a and the second semiconductor layer 154b are respectively disposed on the first gate electrode 124a and the second gate electrode 124b.

Ohmic contacts 163 and 165 are disposed on the first semiconductor layer 154a and the second semiconductor layer 154b. The ohmic contacts may be omitted depending on an exemplary embodiment.

Data conductors including a data line 171, a driving voltage line 172, a first drain electrode 175a, and a second drain electrode 175b are disposed on the ohmic contacts 163 and 165 and the gate insulating layer 140.

The data line 171 includes a first source electrode 173a that extends toward the first gate electrode 124a. The driving voltage line 172 includes a second source electrode 173b that extends toward the second gate electrode 124b.

The first drain electrode 175a and the second drain electrode 175b are separated from each other and are separated from the data line 171 and the driving voltage line 172.

The first source electrode 173a and the first drain electrode 175a face each other based on the first gate electrode 124a, and the second source electrode 173b and the second drain electrode 175b face each other based on the second gate electrode 124b.

A passivation layer 180 is disposed on the data conductors 171, 172, 173a, 173b, 175a, and 175b and the exposed semiconductor layers 154a and 154b.

Contact holes 185a and 185b for respectively exposing the first drain electrode 175a and the second drain electrode 175b are positioned in the passivation layer 180, and a contact hole 184 for exposing the second gate electrode 124b is positioned in the passivation layer 180 and the gate insulating layer 140.

A pixel electrode 191 and a connecting member 85 are disposed on the passivation layer 180. The pixel electrode 191 is physically and electrically connected to the second drain electrode 175b through the contact hole 185b, and the connecting member 85 is connected with the second gate electrode 124b and the first drain electrode 175a through the contact holes 184 and 185a.

A partition wall 460 is disposed on the passivation layer 180. The partition wall 460 surrounds a periphery of the pixel electrode 191 like a bank to define an opening, and is made of an organic insulator or an inorganic insulator. The partition wall 460 may be made of a photoresist including a black pigment. In this case, the partition wall 460 may serve as a light blocking member.

An emission layer 470 is disposed on the pixel electrode 191. According to the present exemplary embodiment, the emission layer 470 of the emissive display device is made of a material which emits blue light.

In a case of a general emissive display device, materials uniquely emitting any one light among primary colors such as three primary colors of red, green, and blue are all included. However, in the case of the emissive display device according to the present exemplary embodiment, the color conversion display panel 30 for representing each color of red, green, and blue is positioned at the upper surface of the emissive display device such that only the material emitting the blue light may be included.

A common electrode 270 is disposed on the emission layer 470.

In the emissive display device, the first gate electrode 124a connected to the gate line 121, the first source electrode 173a connected to the data line 171, and the first drain electrode 175a form a switching thin film transistor (TFT) Qs along with the first semiconductor layer 154a, and the channel of the switching thin film transistor Qs is formed in the first semiconductor layer 154a between the first source electrode 173a and the first drain electrode 175a.

The second gate electrode 124b connected to the first drain electrode 175a, the second source electrode 173b connected to the driving voltage line 172, and the second drain electrode 175b connected to the pixel electrode 191 form a driving thin film transistor (TFT) Qd along with the second semiconductor layer 154b, and the channel of the driving thin film transistor Qd is formed in the second semiconductor layer 154b between the second source electrode 173b and the second drain electrode 175b.

The pixel electrode 191, the emission layer 470, and the common electrode 270 form the light emitting diode (LED), and in this case, the pixel electrode 191 is an anode and the common electrode 270 is a cathode, or in contrast, the pixel electrode 191 may be the cathode and the common electrode 270 may be the anode.

This emissive display device may emit the light upward and downward with respect to the first substrate 110 to display the image, and the exemplary embodiment in which the light is emitted upward with respect to the first substrate 110 is described according to an exemplary embodiment of the present invention.

The thin film encapsulation layer is disposed between the color conversion panel 30 and the common electrode 270. The thin film encapsulation layer 400 may be a glass substrate, a polymer substrate, or a polymer layer.

When the thin film encapsulation layer 400 is the glass substrate, a thickness t of the thin film encapsulation layer 400 may be in a range of about 0.03 to less than about 0.07 mm. The thin film encapsulation layer 400 may be provided by etching the glass substrate having a thicker thickness than the above-described range and by providing the glass substrate itself having the thickness of the above-described range.

When the thin film encapsulation layer 400 is the plastic substrate or the polymer layer, the thickness t of the thin film encapsulation layer 400 may be less than about 0.01 mm.

The thin film encapsulation layer 400 according to an exemplary embodiment is provided with the thin thickness such that a length of a path of the light passing through the display panel 10 and the color conversion panel 30 may be reduced.

Although the present disclosure has described an embodiment in which the thin film encapsulation layer 400 is adjacent to the color conversion panel 30 and the first substrate 110 is spaced from the color conversion panel 30, it is also possible that the first substrate 110 is adjacent to the color conversion panel 30 and the thin film encapsulation layer 400 is spaced from the color conversion panel 30 as shown in FIG. 7. In this case, the description of the thin film encapsulation layer 400 described with reference to FIGS. 5 and 6 can be applied to the first substrate 110.

When the first substrate 110 is the glass substrate, a thickness t of the first substrate 110 may be in a range of about 0.03 to less than about 0.07 mm. The first substrate 110 may be provided by etching the glass substrate having a thicker thickness than the above-described range and by providing the glass substrate itself having the thickness of the above-described range.

When the first substrate 110 is the plastic substrate or the polymer layer, the thickness t of the first substrate 110 may be less than about 0.01 mm.

As such, the light emitting display device according to the present exemplary embodiment can provide excellent display quality by improving a luminous efficiency and color reproducibility.

Although specific exemplary embodiments have been described and illustrated above, the present inventive concept is not limited to the exemplary embodiments described herein, and it would be apparent to those skilled in the art that various changes and modifications might be made to these embodiments without departing from the spirit and the scope of the inventive concept. Therefore, changed examples and modified examples should not be individually understood from the technical spirit or the viewpoint of the present inventive concept, and it should be appreciated that modified exemplary embodiments will be included in the appended claims of the present inventive concept.

What is claimed is:

1. A display device comprising:
a color conversion panel; and
a display panel overlapping the color conversion panel,
wherein the color conversion panel includes a third substrate, a light blocking member, a color conversion layer, a transmission layer, and an overcoat layer,
wherein the light blocking member, the color conversion layer, and the overcoat layer are sequentially disposed on the third substrate,
wherein the color conversion layer includes a nano-crystalline semiconductor,
wherein the display panel includes:
a thin film encapsulation layer, and
a first substrate overlapping the thin film encapsulation layer, disposed more adjacent to the color conversion layer than the thin film encapsulation layer, and including a thin film transistor disposed on the first substrate, and
wherein the thickness of the first substrate is less than that of the thin film encapsulation layer, and light emitted from the display panel passes through the color conversion panel.

2. The display device of claim 1, wherein the display panel including a light emitting diode.

3. The display device of claim 1, wherein the thin film encapsulation layer is a glass substrate, a plastic substrate, or a polymer layer.

4. The display device of claim 3, wherein the thickness of the glass substrate is greater than about 0.03 mm and less than about 0.07 mm.

5. The display device of claim 3, wherein the thickness of the plastic substrate or the polymer layer is about 0.01 mm or less.

6. The display device of claim 1, wherein the overcoat layer is disposed between the color conversion layer and the display panel and between the transmission layer and the display panel.

7. The display device of claim 1, further comprising a photo-filter layer between the color conversion layer and the transmission layer.

8. A display device comprising:
a color conversion panel; and
a display panel overlapping the color conversion panel,
wherein the color conversion panel includes a third substrate, a light blocking member, a color conversion layer, a transmission layer, and an overcoat layer,
wherein the light blocking member, the color conversion layer, and the overcoat layer are sequentially disposed on the third substrate,
wherein the color conversion layer includes a nano-crystalline semiconductor,
wherein the display panel includes:
a first substrate, and
a second substrate overlapping the first substrate, spaced from the color conversion layer than the first substrate, and including a thin film transistor disposed on the second substrate, and
wherein the thickness of the second substrate is less than that of the first substrate, and light emitted from the display panel passes through the color conversion panel.

9. The display device of claim 8, wherein the display panel further includes a light emission layer emitting light between the first substrate and the second substrate.

10. The display device of claim 8, wherein the first substrate is a glass substrate, a plastic substrate, or a polymer layer.

11. The display device of claim 10, wherein the thickness of the glass substrate is greater than about 0.03 mm and less than about 0.07 mm.

12. The display device of claim 10, wherein the thickness of the plastic substrate or the polymer layer is about 0.01 mm or less.

13. The display device of claim 8, wherein the overcoat layer is disposed between the color conversion layer and the display panel and between the transmission layer and the display panel.

14. The display device of claim 8, further comprising a photo-filter layer between the color conversion layer and the transmission layer.

* * * * *